United States Patent [19]
Ono et al.
[11] 3,780,426
[45] Dec. 25, 1973

[54] METHOD OF FORMING A SEMICONDUCTOR CIRCUIT ELEMENT IN AN ISOLATED EPITAXIAL LAYER

[76] Inventors: Yuichi Ono, Kokubunji; Hiroji Saida, Hachioji; Masayoshi Nomura; Kyyotake Naraoka, both of Kokubunji, all of Japan

[22] Filed: Oct. 12, 1970

[21] Appl. No.: 80,104

[30] Foreign Application Priority Data

Oct. 15, 1969 Japan ............................... 44/81877
Oct. 23, 1969 Japan ............................... 44/84188

[52] U.S. Cl. ......................... 29/580, 29/578, 29/590
[51] Int. Cl. ............................................ B01j 17/00
[58] Field of Search ....................... 148/187; 29/580, 29/578

[56] References Cited

UNITED STATES PATENTS 3,237,062 2/1966 Murphy ............................. 317/234
3,547,716 12/1970 DeWitt et al. ...................... 148/175
3,575,741 4/1971 Murphy ............................ 148/175

*Primary Examiner*—Charles W. Lanham
*Assistant Examiner*—W. Tupman
*Attorney*—Craig & Antonelli

[57] ABSTRACT

Method for isolation comprising the steps of forming layers with a high impurity concentration along one surface of a semiconductor substrate growing a semiconductor epitaxial layer on one surface of the semiconductor substrate, said epitaxial layer having a conductivity type opposite to that of said high impurity concentration layer, forming at least one groove in said epitaxial layer in such a manner that the groove divides the said epitaxial layer into a plurality of regions, diffusing an impurity with opposite conductivity type to the epitaxial layer from all surfaces of the groove into the epitaxial layer and depositing a metal or an insulating layer in the groove.

13 Claims, 36 Drawing Figures

INVENTORS

YUICHI ONO, HIROJI SAIDA, MASAYOSHI NOMURA AND KIYOTAKE NARAOKA

BY Craig, Antonelli, Stewart & Hill

ATTORNEYS

INVENTORS

YUICHI ONO, HIROJI SAIDA,
MASAYOSHI NOMURA AND
KIYOTAKE NARAOKA

BY Craig, Antonelli, Stewart & Hill

ATTORNEYS

PATENTED DEC 25 1973

3,780,426

SHEET 3 OF 8

INVENTORS

YUICHI ONO, HIROJI SAIDA,
MASAYOSHI NOMURA AND
KIYOTAKE NARAOKA

BY Craig, Antonelli, Stewart & Hill

ATTORNEYS

INVENTORS
YUICHI ONO, HIROJI SAIDA,
MASAYOSHI NOMURA AND
KIYOTAKE NARAOKA

BY Craig, Antonelli, Stewart & Hill
ATTORNEYS

INVENTORS
YUICHI ONO, HIROJI SAIDA,
MASAYOSHI NOMURA AND
KIYOTAKE NARAOKA

BY Craig, Antonelli, Stewart & Hill
ATTORNEYS

INVENTORS

YUICHI ONO, HIROJI SAIDA,
MASAYOSHI NOMURA AND
KIYOTAKE NARAOKA

BY Craig, Antonelli, Stewart & Hill

ATTORNEYS

INVENTORS

YUICHI ONO, HIROJI SAIDA,
MASAYOSHI NOMURA AND
KIYOTAKE NARAOKA

BY Craig, Antonelli, Stewart & Hill

ATTORNEYS

INVENTORS

YUICHI ONO, HIROJI SAIDA,
MASAYOSHI NOMURA AND
KIYOTAKE NARAOKA

BY Craig, Antonelli, Stewart & Hill

ATTORNEYS

METHOD OF FORMING A SEMICONDUCTOR CIRCUIT ELEMENT IN AN ISOLATED EPITAXIAL LAYER

BACKGROUND OF THE INVENTION

1. Field Of The Invention

This invention relates to the usually termed isolation method and, more particularly, to the method of electrically separating the semiconductor epitaxial layer grown atop a semiconductor substrate into a plurality of isolated regions. More specifically, the invention concerns the method of diffusion forming semiconductor circuit elements such as transistors, diodes and resistive elements in respective epitaxial layer regions to be isolated concurrently with the step of isolating these epitaxial layer regions.

2. Description Of The Prior Art

In the manufacture of integrated circuits (IC) and large-scale integrated circuits (LSI), it is very important to effectively isolate divisions of a semiconductor epitaxial layer grown atop a semiconductor substrate, to reduce the steps involved in the formation of circuit elements in the isolated regions to facilitate the heat transfer from the IC or LSI manufactured for use for high power applications, and to improve the high frequency characteristics of the circuit elements or the IC or LSI constituted by a combination of these circuit elements.

Regarding the first problem of effectively isolating divisions of the epitaxial layer, isolation through P-N junctions and isolation through an insulator have heretofore been proposed. In the first isolation method utilizing P-N junctions, an impurity of the conductivity type opposite to the conductivity type of the epitaxial layer is selectively diffused from the surface of the epitaxial layer thereinto until the diffusion regions substantially reach the semiconductor surface to form a plurality of P-N junctions in the epitaxial layer, thereby defining a plurality of regions to effect the isolation of the divided epitaxial layer regions by utilizing the reverse characteristics of the P-N junctions thus formed.

This method, however, requires the step of diffusing an isolation impurity at a high temperature for a long period until the diffusion regions reach the substrate surface. The period required for the isolation diffusion is proportional to the square of the thickness of the epitaxial layer. Thus, with a comparatively thick epitaxial layer the isolation requires a very long time, giving rise to various problems.

The second isolation method utilizing an insulator provides very excellent isolation characteristic as compared to the isolation method utilizing P-N junctions. However, this method involves complicated steps, and with this method the yield is not high.

For example, the case of forming a transistor, diode or resistive element by diffusing an impurity into the epitaxial layer, after the diffusion of an isolation impurity a different, a P-type or N-type impurity is diffused into the epitaxial layer to form the predetermined circuit element. In the case of a transistor, two diffusion steps of diffusing a base impurity to form a base region and diffusing an emitter impurity to form an emitter region are necessary subsequent to the diffusion of an isolation impurity. In this case the two diffusion steps require a long time. Furthermore, extra precision steps of diffusion mask alignment are involved in the formation of the circuit element, which constitutes a factor in reducing the yield.

In the manufacture of an IC and an LSI for high frequency purposes, it is important to reduce the collector resistance of transistors as the constituent elements. To reduce the collector resistance, it has been the usual practice to provide a high impurity concentration layer (buried layer) between the semiconductor substrate proper and the epitaxial layer. With the provision of the buried layer, the carriers having crossed the P-N junction pass through the buried layer to a passage leading to a collector electrode overlaying the epitaxial layer. Thus, the collector resistance can be considerably reduced. However, because of the high resistance of the epitaxial layer extending between the buried layer and the collector electrode considerable reduction of the transistor resistance cannot be expected.

In a further aspect, it is recognized that heat is generated in an IC and an LSI during their operation. The generation of heat in the constituent elements in an IC and an LSI results in unstable electric characteristics of them. Since in an IC or an LSI numerous transistors, diodes and other elements are closely arranged in a semiconductor substrate, heat generated in any one circuit element has a great effects on the electric characteristics of the overall circuit. Therefore, an IC or an LSI capable of providing satisfactorily high output has not been realized. Heat is usually generated during the operation of an IC or an LSI in the collector junction and collector region of the transistor and within the substrate, so that it cannot be readily released into the external atmosphere, thus affecting the electric characteristics of other circuit elements formed in the same substrate.

SUMMARY OF THE INVENTION

It is an object of the invention to provide a novel method of isolating epitaxial layer regions in a short time.

Another object of the invention is to provide a novel method of fablicating a transistor having a low collector saturation resistance, in which the transistor is formed in a divided epitaxial layer region while concurrently isolating the epitaxial layer region.

A further object of the invention is to provide a novel method of fabricating a transistor, in which a transistor construction having an emitter region, a base region and a collector region is formed concurrently with the isolation of the epitaxial layer region.

A still further object of the invention is to provide a novel method of fabricating a semiconductor curcuit element, whereby the heat transfer characteristic of the isolated epitaxial layer region is improved.

A further object of the invention is to provide a novel method of fabricating a transistor having an excellent heat transfer characteristic.

Another object of the invention is to provide a novel method of fabricating a semiconductor circuit element, whereby a circuit element having excellent high frequency characteristic is formed in an isolated epitaxial layer region.

The above various objects of the invention are achieved by preliminarily diffusion forming a high impurity concentration layer (buried layer) of a first conductivity type in a semiconductor substrate, then growing an epitaxial layer of the conductivity type opposite to said first conductivity type atop said semiconductor substrate, subsequently forming at least one closed groove in said epitaxial layer to define an eventual isolated region or eventual isolated regions, diffusing an impurity of the conductivity type opposite to the conductivity type of the epitaxial layer from the surfaces of said groove or grooves into the epitaxial layer, and applying a metal layer or an insulating layer on the groove surfaces, thereby forming a circuit element in the isolated epitaxial layer region or regions.

Particularly, if the groove surfaces are covered with a metal layer, the isolated epitaxial layer region is surrounded by a metal layer, so that the heat transfer characteristic of the epitaxial layer region may be improved.

In accordance with the invention, it is important to the end of ensuring the isolation of the epitaxial layer region that if the groove formed in the epitaxial layer does not reach the buried layer, part of an impurity diffusion layer extending along the bottom of the groove should overlap or become contiguous to a conductivity inversion layer formed in the epitaxial layer through the solid phase diffusion of the impurity contained in the buried layer into the epitaxial layer during the formation of said impurity diffusion layer.

Particularly, if the depth of the groove formed in the epitaxial layer is less than 2 microns, the possibility of causing the breakage of a wiring metal layer, which is usually used in the semiconductor device such as an IC and an LSI, and of causing cracks and pin holes in an insulating film such as an $SiO_2$ film which is also usually used in the semiconductor device, due to the presence of the groove being extremely reduced.

If the groove is deep and has a depth substantially equal to the thickness of the epitaxial layer, the impurity diffusion layer formed along the groove surfaces may be shallow and the time required for the diffusion treatment may be short. However, with a deep groove the wiring metal layer or the thin insulating layer usually employed in the area of fabricating semiconductor devices are likely to suffer from accidental breakage or cracks. In this respect, it is important to form the wiring metal layer or insulating layer on the semiconductor wafer after providing a substantially flat surface of the epitaxial layer by filling the groove with metal or an insulating material, as will be desirbed hereinafter in connection with some preferred embodiments.

If a circuit element such as a transistor and diode is formed in the above isolated epitaxial layer region, heat generated in such a circuit element will be rapidly removed, so that the electric characteristics of such a circuit element and the overal circuit device may be stabilized.

In accordance with another aspect of the invention, the metal layer surrounding the isolated epitaxial layer region may be made the collector electrode of a transistor to considerably reduce the collector resistance of the transistor, as will be described hereinafter in connection with a preferred embodiment. Besides, by so doing it is possible to realize a transistor for high frequency purposes or a transistor capable of providing a high output, since the heat generated in such a transistor can flow go out through the collector electrode.

In accordance with a further aspect of the invention, in the step of diffusing an isolation impurity from the surfaces of the groove formed in the epitaxial layer thereinto, the same impurity may be simultaneously diffused from predetermined surface portions of the isolated epitaxial layer region. In this manner, the diffusion of the isolation impurity and the diffusion of an impurity for the formation of a circuit element, which have heretofore been separately carried out, may be made simultaneously, thus simplifying the manufacturing procedure.

Particularly, by diffusing an emitter impurity in the step of forming the isolation layer the collector, emitter and base regions of a transistor may be formed at one time, as will be described hereinafter in connection with a preferred embodiment.

In the preferred embodiment of the invention, the epitaxial layer is formed by the gaseous phase growth period. However, it may be formed by other methods.

Also, in the preferred embodiment of the invention the formation of the groove in the epitaxial layer is achieved through the photo-etching process, which is frequently employed in the semiconductor industry. The etching treatment is carried out by using either liquid phase or gaseous phase etching agent.

The groove formed in the epitaxial layer usually reaches the semiconductor substrate. However, to obtain the effects of the invention the groove need not reach the substrate surface but it is sufficient if the depth of the groove is such that the impurity diffusion layer formed along the groove is sufficiently deemed to reach the substrate surface.

The metal to be filled in the groove formed in the epitaxial layer may be any metal capable of forming ohmic contact with the epitaxial layer. Usually, it may be aluminum, gold, molybdenum, tantalum, tungsten, copper, nickel, cobalt, etc., or an alloy of these metals. A single metal layer or two or more metal layers may be used. These metal layers may be suitably formed by such means as vapor deposition, electric plating, sputtering and the like.

BRIEF DESCRIPTION OF THE DRAWING

FIG. 14 is a section taken along line A—A' in FIG. 15, and FIG. 16 is a section taken along line B-B' in FIG. 15.

FIG. 24 is a section taken along line A—A' in FIG. 25.

DESCRIPTION OF THE PREFERRED EMBODIMENTS

Embodiment 1

FIGS. 1 through 9 inclusive illustrate the fundamental steps in the method of diffusion forming a resistive region in an isolated epitaxial layer embodying the invention. It is to be noted that the principal parts are enlarged in relative size to clarify the illustration.

Figures 1, 2, 3, 4, 5, 6, 7, 8, 9:
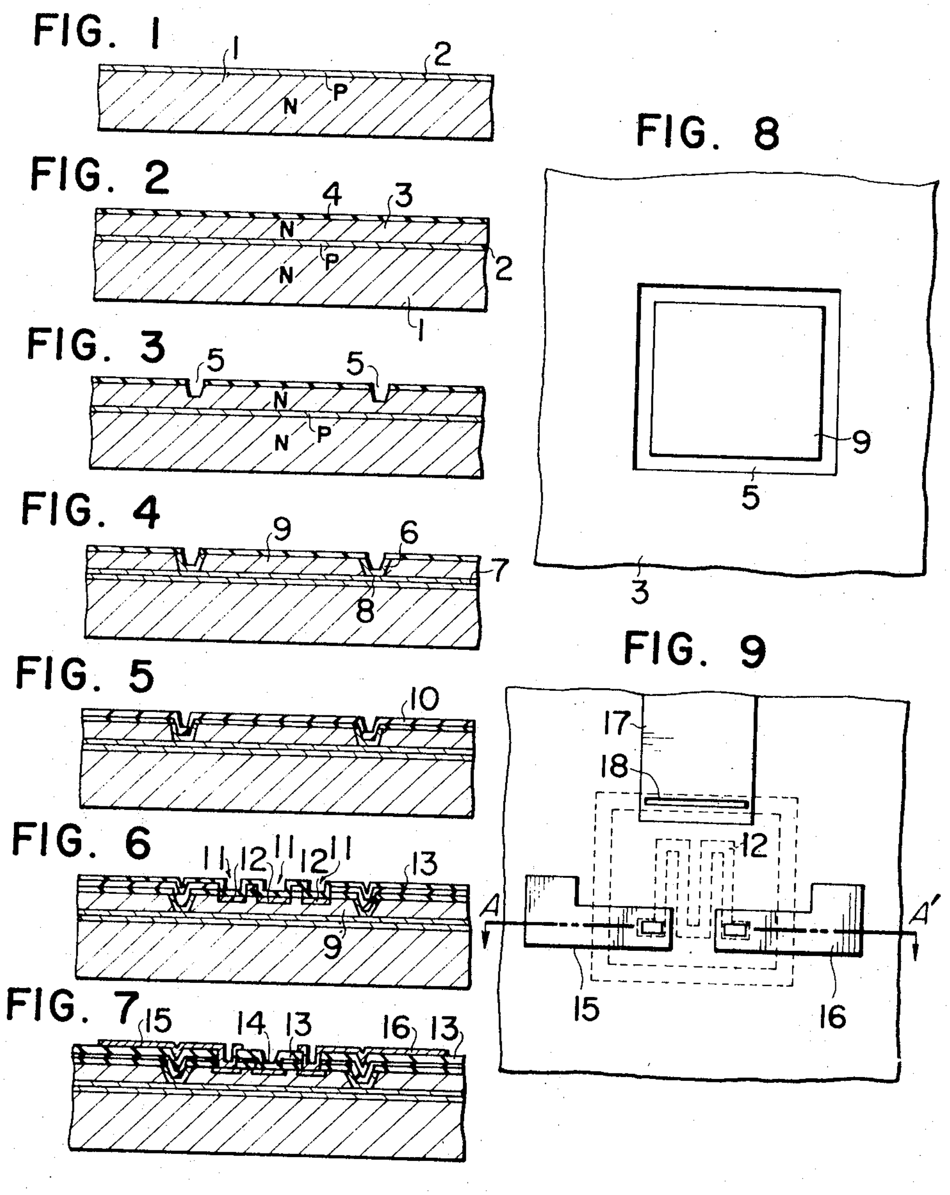
FIGS. 1 to 9 illustrate, in sectional views in FIGS. 1 to 7 and in plan view in FIGS. 8 and 9, the steps involved in the diffusion formation of a resistive region in an isolated epitaxial layer region embodying the invention.

Reference numeral 1 in FIG. 1 designates an N-type silicon substrate. In the instant embodiment of the invention, the conductivity type of the substrate is immaterial. A high impurity concentration layer 2 of P-conductivity type is diffusion formed in the substrate 1 by diffusing an impurity into the substrate from one surface thereof. The impurity concentration of the high impurity concentration layer, which is usually termed and hereinafter referred to as a buried layer, may be selected to a desired value. In this embodiment it is selected to be about $10^{21}$ atoms per cubic centimeter. In this embodiment the diffusion formed buried layer may be replaced with a thin epitaxial layer having a high impurity concentration formed atop the substrate.

After the formation of the required buried layer 2, an epitaxial layer 3 of N-conductivity type is grown atop the buried layer. Then, an insulating semiconductor protection film of a material known in the semiconductor industry such as $SiO_2$, $Si_3N_4$, $Al_2O_3$, etc., for instance a silicon dioxide film 4, is formed on the epitaxial layer 3. The silicon dioxide film may be formed by the high temperature oxidation of the silicon epitaxial layer 3 or by the pyrolysis of monosilane or organoxysilane.

Subsequently, the silicon dioxide layer is selectively etched to expose the corresponding surface portion of the eptitaxial layer for the formation of the eventual isolated epitaxial layer region. The selective etching of the silicon dioxide layer may be carried out by the photo-etching method. Alternatively, it may be achieved through such ultrafine processes as an ion beam process, electron beam process and so forth. The exposed portion of the semiconductor epitaxial layer is then etched to form a shallow closed groove. This may be achieved through gaseous phase etching using such gaseous etching agents as HC1 vapor, liquid etching using an etching liquid chiefly composed of nitric acid and fluoric acid, or beam etching using an ion beam or an electron beam. In this step, the depth of the groove is very important. In order that the subsequent impurity diffusion to form an isolation layer requires less time, the groove is desirably as deep as possible and the bottom of the groove is very close to the interface between the epitaxial layer and the semiconductor substrate. On the other hand, it is desirable that it should be as shallow as possible from the standpoint of preventing the breaking of electrode leads and cracks in the protective film such a silicon dioxide film. To satisfy both these opposite requirements the depth of the groove should be 0.3 to 2.0 microns. However, this is not a strict condition, but will be varied in dependence upon the thickness of the metal layer constituting the lead and the thickness of the silicon dioxide protection film. The groove thus formed in the epitaxial layer may be of any desired shape, but it is important that the groove should divide the surface of the epitaxial layer into a plurality of portions to form the corresponding isolated regions.

FIG. 8 is a plan view of the semiconductor wafer shown in FIG. 3. In the Figure, numeral 3 designates the epitaxial layer covered with the $SiO_2$ film, and numeral 5 the groove formed in the expitaxial layer. Though the illustrated groove is square in shape, other shapes such as rectangular and circular shape may be suitably employed. Numeral 9 designates the portion of the epitaxial layer surface enclosed within the groove 5 for the formation of the eventual isolated region.

After the formation of the groove as shown in FIG. 3, an isolation impurity, in this embodiment a P-conductivity type impurity such as boron, is diffused from the groove surfaces into the epitaxial layer to form a P-type impurity diffusion layer 6 surrounding the groove. In this step, the wafer is treated at a high temperature for the impurity diffusion. As a result, the impurity within the buried layer is simultaneously diffused into the epitaxial layer to form an inversion layer 7 of the conductivity type opposite to the conductivity type of the epitaxial layer in the epitaxial layer. In this step, it is important that the impurity diffusion layer 6 overlaps or becomes contiguous to the inversion layer 7. In other words, the process of diffusing the isolation impurity is continued until the impurity diffusion layer 6 and inversion layer 7 overlap each other. When the layers 6 and 7 overlap each other as shown in FIG. 4, the epitaxial layer region 9 enclosed within the groove 5 is completely isolated from the rest of the epitaxial layer. The time required for the diffusion of the isolation impurity in the step of FIG. 4 is greatly reduced as compared to the time required in the convertional treatment by virtue of the groove formed in the epitaxial layer 9.

FIGS. 5 to 7 illustrate the steps of forming an impurity diffusion resistive region by selectively diffusing an impurity into the isolated epitaxial layer region 9 shown in FIG. 4.

An $SiO_2$ film 10 is deposited on the surface of the epitaxial layer by the pyrolysis of silane. Then, the epitaxial layer is selectively photo-etched to form an opening 11 corresponding in shape to the shape of the eventual impurity diffusion resistive region. Then, a P-conductivity type impurity is diffused through the opening 11 into the isolated epitaxial layer region 9 to form a resistive region 12. The impurity diffusion at this time is usually carried out in an oxidizing atmosphere, so that an oxide film 13 contiguous to the resistive region is formed on the wafer.

Thereafter the silicon dioxide film 13 is selectively etched to expose portions 14 of the resistive region 12 to provide electrodes. Then, wiring metal layers 15 and 16 contiguous to the respective portions 14 of the resistive region are formed by the deposition of aluminum.

The resultant wafer is shown in section in FIG. 7 and in plan view in FIG. 9. Actually, FIG. 7 is a section along line A—A′ in FIG. 9. In FIG. 9, numeral 17 designates a wiring metal layer leading to a power supply to apply a bias voltage to the isolated epitaxial layer region. It overlies the silicon dioxide layer 13 and is connected through an opening formed therein to the isolated epitaxial layer region as indicated at 18.

In this embodiment, the resistive region 12 may be formed simultaneously with the formation of the impurity diffusion 6 for the isolation of the epitaxial layer region 9. In this manner, both the isolation layer and the resistive region may be formed by a single step of diffusing an impurity, thus further reducing the manufacturing time.

Embodiment 2

FIGS. 10 through 16 inclusive illustrate a novel method of forming a transistor element embodying the invention.

In this embodiment, an emitter region, a base region and an isolation region are formed simultaneously with the formation of a collector region by the diffusion of an impurity.

Figure 10:
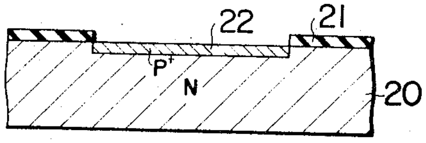
FIGS. 10 to 16 illustrate, in sectional views in FIGS. 10 to 14 and FIG. 16 and in a plan view in FIG. 15, the steps involved in the formation of a transistor in an isolated epitaxial layer region embodying the invention. Particularly.
Figure 11:
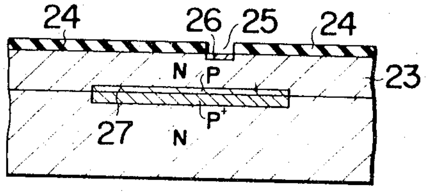
Figure 12:
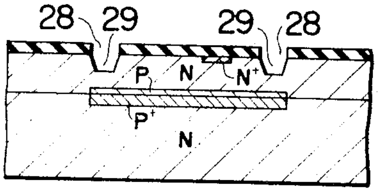
Figure 13:
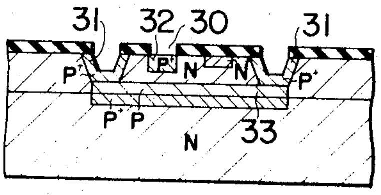

Reference numeral 20 in FIG. 10 designates an N-conductivity type silicon substrate, on one surface of which is formed a $SiO_2$ film as a diffusion mask for the selective diffusion of a P-type impurity through an aperture or window formed in the mask into the silicon substrate to form a P-type high impurity concentration layer 22 (buried layer) therein.

After the P-type impurity diffusion, the $SiO_2$ diffusion mask is entirely removed off the substrate surface, and then an N-conductivity type silicon epitaxial layer 23 is grown on the substrate surface. Atop the epitaxial layer 23 is then formed a $SiO_2$ diffusion mask having an aperture 25. Then, an N-type impurity is diffused through the aperture 25 in the $SiO_2$ film into the epitaxial layer 23 to form an $N^+$-type high impurity concentration diffusion layer 26 therein. The diffusion layer 26 serves as the electrode of the base region to be formed eventually. The impurity diffusion at this time is carried out in an oxidizing atmosphere, so that an oxide film contiguous to the diffusion layer 26 is formed on the wafer.

Subsequently, a portion of the $SiO_2$ film covering the epitaxial layer above the merginal portion of the buried layer 22 is selectively etched to form an opening 28 in the $SiO_2$ film. Then, the exposed portion of the semiconductor epitaxial layer within the opening 28 is etched to form a groove 29. This may be achieved through any known etching process. In this embodiment this is achieved through gaseous phase etching using HC1 vapor. In this step, the depth of the groove is very important. If the depth of the groove is greater than 2 microns, the problem of causing the breaking of electrode leads and cracks to the $SiO_2$ film formed on the groove is serious, and if it is less than 1.3 microns, the effect of reducing the time required for the diffusion process for the formation of the isolation layer cannot be made outstanding. Accordingly, the depth of the groove to be formed in the epitaxial layer is selected to be within a range of 0.3 to 2.0 microns. In practice, the depth of the groove is determined by taking the thickness of the epitaxial layer, width of the base region, temperature required for the impurity diffusion process, impurity concentration of the buried layer, thickness of the $SiO_2$ film to be formed on the groove surfaces and thickness of the metal electrode into consideration.

After the formation of the groove, the $SiO_2$ film on the epitaxial layer is selectively etched to form an aperture 30 for the formation of the emitter region. Then, a P-type impurity is diffused into the epitaxial layer to form P-type impurity diffusion layers 31 and 32 therein. The diffusion layer 31 surrounds the groove, and it constitutes an isolation region. The diffusion layer 32, which is formed in the isolated epitaxial layer region, constitutes the emitter region of a transistor. The isolation region 31 overlaps an inversion layer 33 of the same conductivity type, which is formed by the diffusion of the impurity contained in the buried layer into the epitaxial layer. The inversion layer 33 constitutes the collector region of the transistor, so that it is important that the layer 33 is not contiguous to the P-type impurity diffusion layer 32 (constituting the emitter region).

By the above impurity diffusion step an isolated transistor construction may be completed.

Subsequently, the $SiO_2$ film remaining on the epitaxial layer surface is completely etched off, and pure $SiO_2$ is formed by the pyrolysis of silane and is then selectively etched to from apertures 35, 36, 37 for collector, emitter and base electrodes, respectively, and then for the formation of emitter, base and collector electrodes 38, 39 and 40, for instance, aluminum layer 38, 39 and 40 are deposited selectively by a vacuum evaporation of the aluminum.

Figure 14:
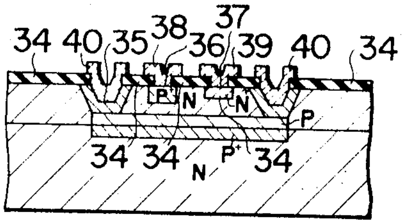
Figure 15:
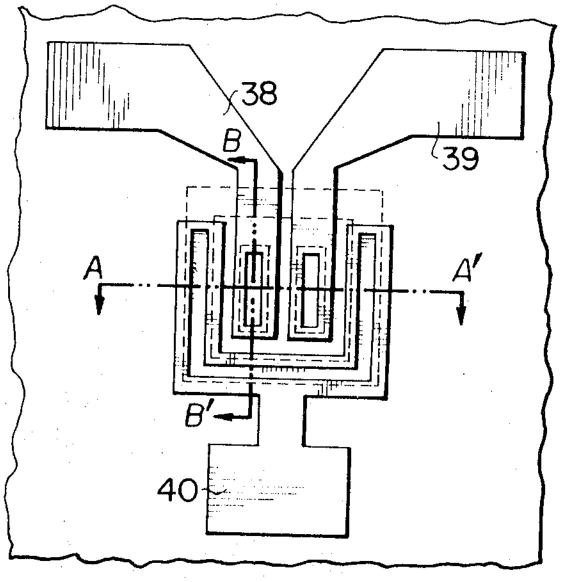
Figure 16:
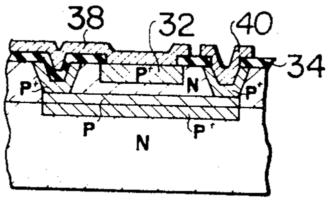

The resultant wafer is shown in plan view in FIG. 15. FIG. 14 is a section taken along line A—A' in FIG. 15. FIG. 16 is a section taken along line B—B' in FIG. 15.

Embodiment 3

FIGS. 17 through 25 inclusive illustrate another embodiment of the method of diffusion forming a resistive region in an isolated epitaxial layer according to the invention.

Figures 17, 18, 19, 20, 21:
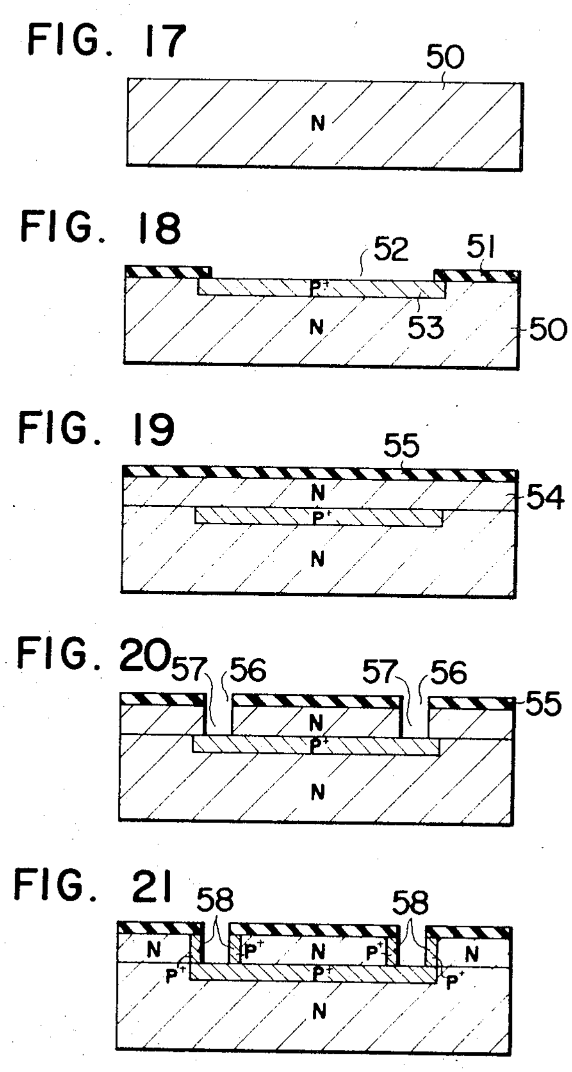
FIGS. 17 to 25 illustrate, in sectional views in FIGS. 17 to 24 and in a plan view in FIG. 25, the steps of another embodiment of the invention, in which a resistive region is diffusion formed in an isolated epitaxial layer region. Particularly.

Reference numeral 50 in FIG. 17 designates an N-conductivity type silicon substrate.

On one princial surface of the substrate is formed a diffusion mask 51 consisting of a $SiO_2$ film, and a P-type impurity is diffused through an aperture or window 52 formed in the mask into the substrate to form a P-type high impurity concentration layer 53 therein.

Then, the $SiO_2$ film is completely removed from the substrate surface, and an N-type silicon layer 54 is epitaxially grown atop the substrate. The epitaxial layer is formed by the reduction of $SiCl_4$ with hydrogen. To impart N-conductivity type a small amount of $PH_3$ is incorporated into the reducing vapor. Then, a $SiO_2$ film 55 is formed on the surface of the epitaxial layer 54 by the high temperature oxidizing method. The $SiO_2$ film thus formed is then selectively photo-etched to form a narrow opening 56. Then, the exposed portion of the epitaxial layer within the opening 56 is etched by using HC1 vapor until the corresponding portion of the buried layer in the substrate is exposed, thus forming a groove 57 as shown in FIG. 20. Then, a P-type impurity is diffused from the surfaces of the groove into the epitaxial layer to form an impurity diffusion layer 58 therein.

Thereafter, the surface of the groove is coated with a thin layer of molybdenum by sputtering thereof. Then the groove is filled with gold by means of vacuum evaporation. Numeral 60 in FIG. 22 designates the deposited gold layer buried in the groove.

Figure 22:
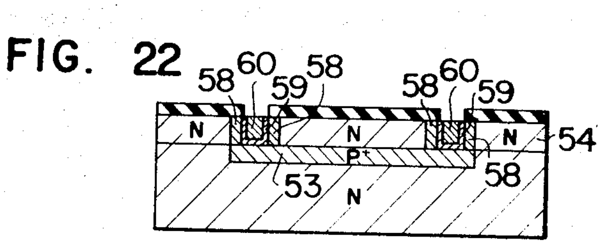

As is seen from FIG. 22, a portion of the epitaxial layer 54 formed atop the semiconductor substrate is divided into a plurality of electrically isolated regions by the impurity diffusion layer 58 and the high impurity concentration layer 53 and the isolated layer portion is surrounded by the metal layer.

Figure 23:
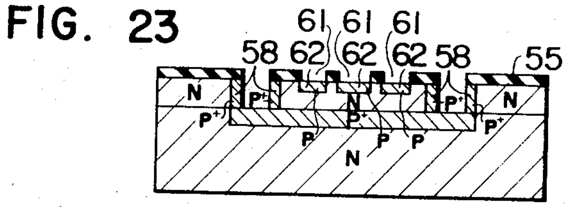

To form a circuit element by diffusing an impurity into the epitaxial layer portion surrounded by the metal layer subsequent to the step shown in FIG. 22, the $SiO_2$ film 55 on the enclosed epitaxial layer portion within the groove is selectively etched to from a predetermined opening 61 as shown in FIG. 23. Then a P-type impurity is diffused into the exposed portion of the epitaxial layer not covered with the $SiO_2$ film to form an impurity diffusion isolation layer 58 and an impurity diffusion resistive layer 62 in the epitaxial layer. In this step, a thin oxide film is formed on the surfaces of the epitaxial layer. A portion of the oxide film on the surfaces of the groove is removed.

Figure 24:
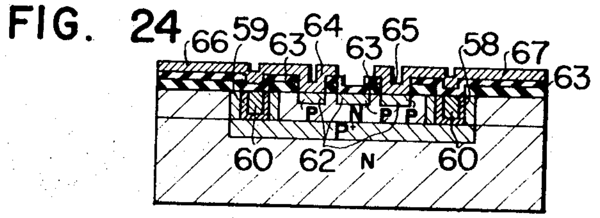

Then, metal layers 59 and 60 are successively formed within the groove as shown in FIG. 24. A new $SiO_2$ film 63 is formed by the pyrolysis of silane as shown in FIG. 24. The $SiO_2$ film 63 is then selectively etched to form apertures 64 and 65 for the deposition of metal electrodes 66 and 67.

Figure 25:
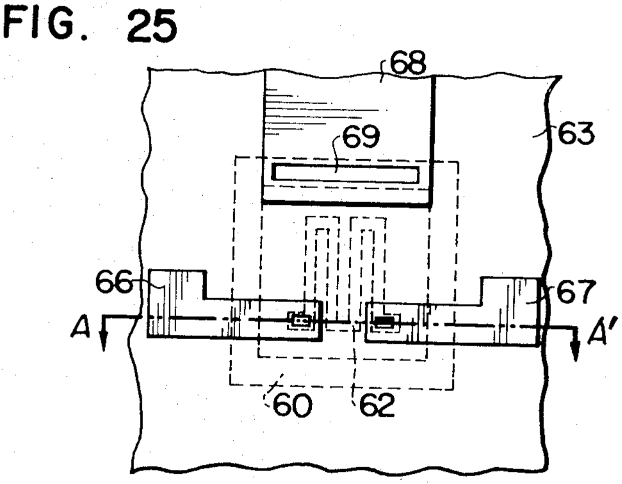
Figure 26:
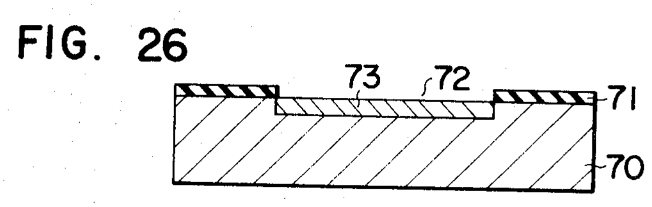
FIGS. 26 to 35 illustrate, in sectional views in FIGS. 26 to 34 and in a plan view in FIG. 35, the steps of a further embodiment of the invention, in which a transistor is formed in an isolated epitaxial layer region.

FIG. 25 is a plane view of the wafer shown in FIG. 24, with like reference numerals designating like parts and FIG. 24 in a longitudinal cross-sectional view at A—A' line in FIG. 25. In the figure, numeral 68 designates a metal layer formed simultaneously with the metal layers 66 and 67. It overlies the $SiO_2$ layer and is connected through an opening formed therein to the metal layers 59 and 60 as indicated at 69. Through the metal layer 68 a reverse bias voltage is applied to the isolated epitaxial layer portion.

With the semiconductor element fabricated in accordance with this embodiment, heat generated at the resistive layer 62 is taken up by the surrounding metal layers 59 and 60 and is then released to the outside through the metal layer 68.

Embodiment 4

FIGS. 26 through 35 inclusive illustrate another embodiment of the method of forming a transistor element according to the invention.

A transistor is fabricated from a mirror surface finished silicon crystal substrate 70, for instance, of N-conductivity type and having a resistivity of 10 Ω cm and one principal surface lying in crystal place (100). A first oxide layer 71 is formed to a thickness of about 7,000 angstroms on the principal surface of the substrate by the thermal oxidizing process. The first oxide film 71 is then selectively photo-etched to form a window 72 therein. Then, boron is diffused through the window into the substrate 70 by elevating the substrate temperature to 1,050°C to form a $P^+$-type high impurity concentration diffusion layer 73 (buried layer) along the substrate surface.

Figure 27:
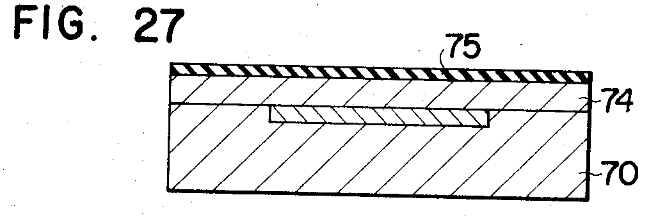

Subsequently, the first oxide layer 71 is removed, and then an N-type semiconductor layer 0.2 Ω cm in resistivity is epitaxially grown atop the substrate 70 to a thickness of 3 to 4 microns as shown in FIG. 27, by placing the wafer in an epitaxial reaction furnace. Then, the epitaxial layer 73 is covered with a second oxide layer about 8,000 angstroms thick formed by the gaseous phase growth process.

Figure 28:
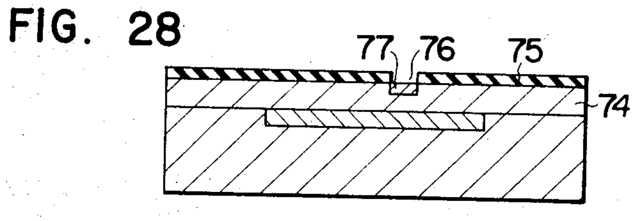

Thereafter, the second oxide layer 75 is selectively photo-etched to form a window 76 therein, and then phosphorus or antimony is diffused through the window into the epitaxial layer 73 at a temperature of 1,100°C to form an $N^+$-type base region 77 therein, as shown in FIG. 28.

Figure 29:
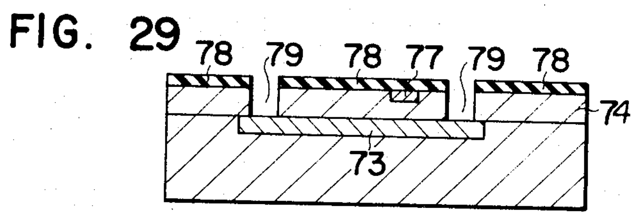
Figure 30:
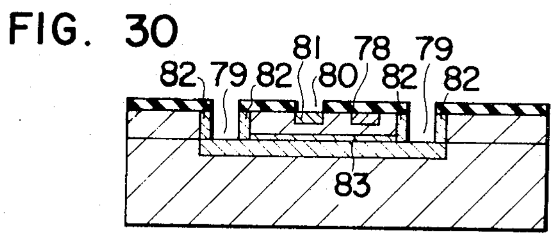
Figure 31:
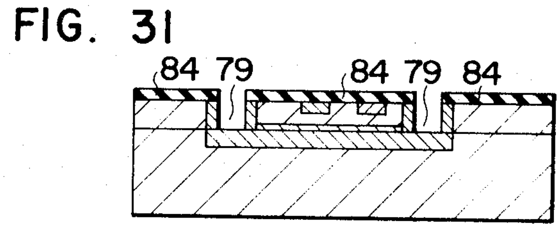
Figure 32:
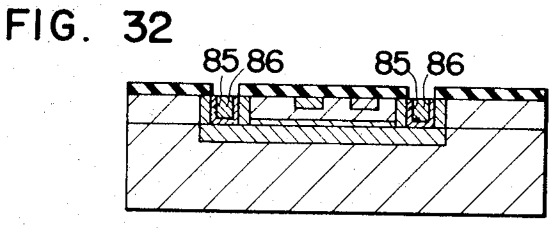
Figure 33:
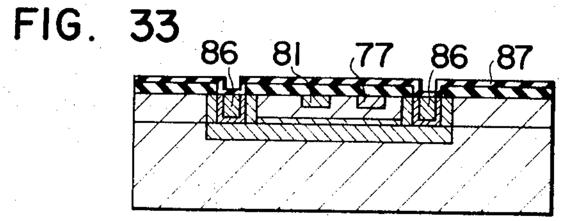

Then, to electrically isolate part of the semiconductor epitaxial layer, the second oxide film 75 is removed from the epitaxial layer, followed by covering the epitaxial layer 73 with a third oxide film 78, which is then selectively photo-etched to form a window, and the exposed portion of the semiconductor epitaxial layer within the window is subjected to the selective gaseous phase etching to form a groove 79 surrounding the base region 77 which substantially penetrates the epitaxial layer to reach the buried layer 73, as shown in FIG. 29.

Then, the third oxide film 78 on the enclosed epitaxial layer portion within the groove 79 is selectively photo-etched to form a window 80 at a predetermined position, through which boron is diffused at a temperature of 1,050°C into the enclosed epitaxial layer portion to form an emitter region 81 therein while simultaneously forming a $P^+$-type impurity diffusion layer 82 along the groove surfaces. In this step, the impurity contained in the buried layer is diffused into the epitaxial layer to form a conductivity inversion layer 83 therein. The inversion layer 83 serves as a collector of the transistor.

Subsequently, the third oxide film is removed, and then a fourth oxide film 84 is formed on the epitaxial layer. Then, the surface portion about the groove is slightly photo-etched. Then, a thin layer 85 of a highly conductive metal capable of forming ohmic contact with the epitaxial layer, for instance molybdenum, is formed by the sputtering process within the groove 79, and then a gold layer 86 is formed within the groove by the field plating process. The metal layers thus formed serve as part of the collector electrode.

Figure 34:
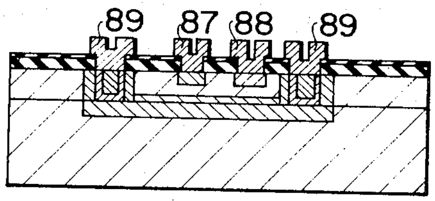
Figure 35:
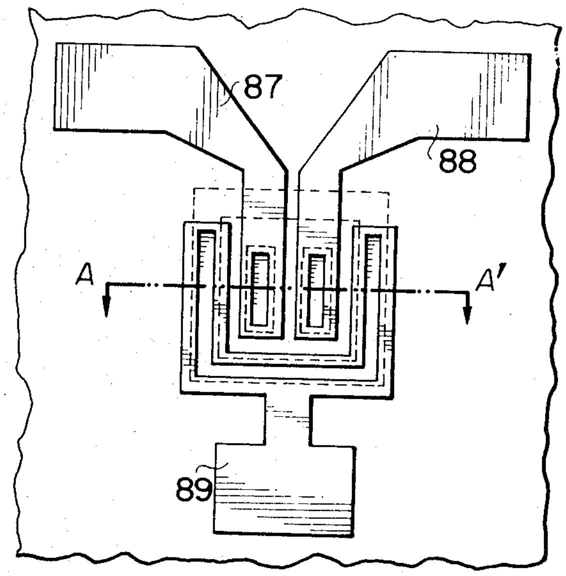

Afterwards, the fourth oxide layer is coated with a fifth oxide layer, which is then selectively photo-etched to expose the base region 77, emitter region 81 and metal layers 85 and 86 within the groove. Then, an electrode metal (for instance, aluminum) is deposited on the exposed portions to form emitter, base and collector electrodes 87, 88 and 89 respectively, as shown in FIG. 34. FIG. 35 is a plan view of the wafer shown in FIG. 34. Particularly, FIG. 34 also is a longitudinal cross-sectional view at A—A' line in FIG. 35.

In this embodiment, the metal layer of such metal as molybdenum and chromium capable of forming ohmic contact with the epitaxial layer is formed by means of sputtering along the surfaces of the groove 79, for the purpose of preventing the diffusion of such metal as gold or copper subsequently filled in the groove since their speed of diffusion into the semiconductor is high. Alternatively, both the molybdenum and gold layers may be formed by the sputtering process.

As has been described in the foregoing, according to the invention by the diffusion of boron from the surfaces of the groove 79 the $P^+$-type impurity diffusion layer 82 formed about the groove extends not only along the sides of the groove but also along the bottom of the groove, so that the isolation of the epitaxial layer portion within the groove may be ensured not only if the groove 79 is so deep as to reach the buried layer 73 but also if it is shallow and does not reach the buried layer in the semiconductor substrate, inasmuch as the impurity diffusion layer extending along the bottom of the groove reaches the surface of the semiconductor substrate.

Also, by the method according to the invention the isolation of the epitaxial layer portion within the groove may be achieved at low temperature in a short period and concurrently in the step of forming the circuit element parts, thus dispensing with an independent isolating step to reduce the manufacturing time required. Further, since the inversion layer developed from the buried diffusion layer is very thin, the epitaxial layer may also be thin. Thus, it is possible to outstandingly improve the base breakdown voltage, high frequency characteristics, current amplification factor ($h_{FE}$), cutoff frequency ($f\alpha$), etc., of the semiconductor element fabricated in accordance with the invention. By way of example, according to the invention it was found to be possible to fabricate P-N-P transistors with $h_{FE}$ of 10 to 100 and $f\alpha$ of 20 to 250 MHz. Furthermore, since the collector region is constituted by the metal layer contiguous to the buried layer, the collector saturation resistance Rcs is extremely small, consuming small power and generating little heat, so that the semiconductor element according to the invention may find high power applications. Still further, since the collector region also serves as the isolation layer, the area occupied by the element may be reduced to about 30 percent of the value conventionally required.

Figure 36:
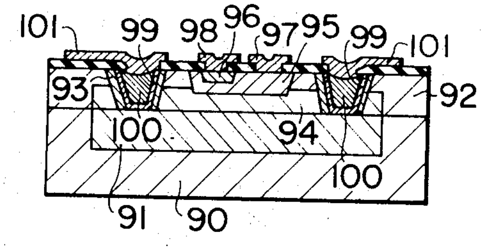
FIG. 36 is a sectional view showing a transistor construction formed in an isolated epitaxial layer region by still a further embodiment of the method according to the invention.

Moreover, according to the invention it is possible to reduce the thickness of the epitaxial layer grown atop the substrate by forming the base region contiguous to the invention layer on the buried layer and diffusing an emitter impurity into the base region to form the emitter region in the base region, as shown in FIG. 36.

In FIG. 36, numeral 90 designates a semiconductor substrate, numeral 91 a buried layer formed along the substrate surface, and numeral 92 an epitaxial layer formed atop the substrate. Numeral 93 designates an impurity diffusion layer formed along the surfaces of a groove in the epitaxial layer by diffusing an impurity from the groove surfaces into the epitaxial layer. It serves both as the collector of the transistor and as the isolation layer. Numeral 94 designates an inversion layer formed as a result of the diffusion of the impurity contained in the buried layer into the epitaxial layer during the impurity diffusion into the epitaxial layer, numeral 95 a base region diffusion formed in the epitaxial layer, numeral 96 an emitter region diffusion formed in the base region, numeral 97 a base electrode contiguous to the base region, numeral 98 an emitter electrode contiguous to the emitter region, numeral 99 a thin metal layer formed within the groove in and in ohmic contact with the epitaxial layer, numeral 100 a highly conductive metal layer, and numeral 101 a collector electrode contiguous to the metal layers.

The semiconductor and the buried layer may be suitably combined irrespective of whether they are of P- or N-conductivity type. Thus, it is possible to extremely readily fabricate an integrated circuit by forming a plurality of circuit elements on the same semiconductor substrate. In this case, the step common to the individual elements is of course carried out at one time.

As is described, according to the invention small-size semiconductor devices having excellent characteristics can be fabricated in an extremely simple manner involving reduced manufacturing steps, which is a great advantage to industry.

We claim:

1. In a method of making a semiconductor circuit element in an isolated semiconductor epitaxial layer, the method including the steps of:

a. forming a high impurity concentration layer of a first conductivity type along one surface of a semiconductor substrate;

b. forming a semiconductor epitaxial layer of a second conductivity type opposite to the first conductivity type on one surface of the semiconductor substrate;

c. etching away at least one predetermined portion of the semiconductor epitaxial layer to form at least one groove therein, said groove extending toward the high impurity concentration layer and dividing the semiconductor epitaxial layer of the second conductivity type into a plurality of regions in the surface thereof;

d. diffusing an impurity of the first conductivity type from the surfaces of the groove into the semiconductor epitaxial layer in such a manner that a layer formed along the surfaces of the groove by the impurity diffusion is overlapped by a conversion region of a conductivity type in the expitaxial layer, said conversion region being formed by solid phase diffusion of the impurity in the high impurity concentration layer into the expitaxial layer, and e. depositing a metal layer on the surfaces of said groove.

2. A method according to claim 1, wherein the depth of the groove formed in the epitaxial layer is shallow compared to that of the epitaxial layer from the surface thereof.

3. In method of making a semiconductor circuit element in an isolated semiconductor epitaxial layer, the method including the steps of:

a. diffusing selectively an impurity of a first conductivity type through a predetermined portion of the surface of a semiconductor substrate so as to form a high impurity concentration layer of the first conductivity type in a desired pattern along the surface thereof;

b. forming an epitaxial layer of a second conductivity type opposite to the first conductivity type on the surface of the semiconductor substrate, said epitaxial layer being of a desired thickness and covering the high impurity concentration layer;

c. etching away the epitaxial layer above the peripheral portion of the high impurity concentration layer so as to form a groove of a desired pattern so that the depth of the groove is shallow against that of said epitaxial layer from the surface thereof and the groove divides the epitaxial layer above said high impurity concentration layer from another epitaxial layer in the surface of the epitaxial layer;

d. diffusing an impurity of said first conductivity type through the surface of the groove in such a manner that an impurity diffusion layer of the first conductivity type formed into said surface of the groove is overlapped by a conversion region of conductivity type which is formed by solid phase diffusion of the impurity in said high impurity concentration layer into the epitaxial layer through interface between the epitaxial layer and the high impurity concentration layer during diffusing of the impurity into the surface of the groove.

4. A method according to claim 3, wherein the impurity of the first conductivity type diffused through all the surfaces of the groove is simultaneously diffused through the predetermined surface of the isolated epitaxial layer so as to form a region of the first conductivity type therein.

5. In a method of making a semiconductor circuit element in an isolated semiconductor epitaxial layer, the method including:

a. forming a high impurity concentration layer of a first conductivity type along one surface of a semiconductor substrate;

b. forming a semiconductor epitaxial layer of a second conductivity type opposite to the first conductivity type on one surface of the semiconductor substrate;

c. etching away at least one predetermined portion of said semiconductor epitaxial layer to form at least one groove therein, said groove reaching said semiconductor substrate of the first conductivity type and dividing said semiconductor epitaxial layer of the second conductivity type into a plurality of regions in the surface thereof;

d. diffusing an impurity of the first conductivity type through the surfaces of the groove; and e. filling a metal within the groove until the surface of the filled metal layer becomes flush with the surface of the epitaxial layer.

6. A method according to claim 5, wherein before the step of filling a metal within the groove, the surfaces of the groove are coated with a thin metal layer capable of forming ohmic connection with the epitaxial layer.

7. A method according to claim 5, wherein when the impurity of the second conductivity type diffused through the all surfaces of the groove is simultaneously diffused through the predetermined surface of the isolated epitaxial layer so as to form a region of the second conductivity type therein.

8. In a method of making a semiconductor circuit element in an isolated semiconductor epitaxial layer, the method including the steps of:

a. forming a high impurity concentration layer of a first conductivity type in a predetermined surface of a semiconductor substrate;

b. forming a semiconductor epitaxial layer of a second conductivity type opposite to the first conductivity type on one surface of the semiconductor substrate;

c. etching away at least one predetermined closed loop portion of the semiconductor epitaxial layer to form at least one groove therein, said groove extending from the surface of the epitaxial layer at least into the epitaxial layer above the high impurity concentration layer and dividing the semiconductor epitaxial layer of the second conductivity type into a plurality of regions in the surface thereof;

d. diffusing an impurity of the first conductivity type from the surfaces of the groove into the semiconductor epitaxial layer until a layer formed along the surfaces of the groove by the impurity diffusion is at least electrically connected with the high impurity concentration layer; and, e. depositing a metal layer on the surfaces of said groove.

9. A method of making a semiconductor circuit element in an isolated semiconductor epitaxial layer in accordance with claim 8, wherein the step of diffusing an impurity of the first conductivity type from the surfaces of the groove into the semiconductor epitaxial layer comprises diffusion of the impurity into the semiconductor epitaxial layer until a layer formed along the surfaces of the groove by the impurity diffusion is overlapped by a conversion region of a conductivity type in the epitaxial layer, said conversion region being formed by solid phase diffusion of the impurity in the high impurity concentration layer into the epitaxial layer.

10. A method of making a semiconductor transistor circuit element in an isolated semiconductor epitaxial layer comprising the steps of:

a. providing a collector and isolation region by forming a high impurity concentration layer of a first conductivity type in a predetermined surface of a semiconductor substrate;

b. forming a semiconductor epitaxial layer of a second conductivity type opposite said first conductivity type on one surface of said semiconductor substrate;

c. etching away at least one predetermined loop portion of said semiconductor epitaxial layer to form at least one groove therein, said groove extending from the surface of said epitaxial layer at least into the epitaxial layer above the high impurity concentration layer and dividing said epitaxial layer into a plurality of regions in the surface thereof;

d. simultaneously defining the extent of the base and collector regions of said transistor and forming the emitter thereof while isolating said base region by simultaneously diffusing an impurity of the first conductivity type from the surface of the groove and from a predetermined surface portion of said epitaxial layer surrounded by said groove into the semiconductor epitaxial layer until a layer formed along the surfaces of said groove by the high impurity diffusion is at least electrically connected with the high impurity concentration layer so as to constitute the collector and isolation regions of said transistor surrounding the base region thereof, into which the emitter region extends from the surface of said epitaxial layer above said high impurity concentration layer, while being spaced therefrom by the base region portion of said epitaxial layer; and e. providing metal contacts on said groove, said base and emitter regions, 11. A method according to claim 7, wherein before the step of filling a metal within the groove, the surfaces of the groove are coated with a thin metal layer capable of forming ohmic connection with the epitaxial layer.

12. A method according to claim 5, wherein an inversion layer of said first conductivity type is out diffused from said high impurity concentration layer into said epitaxial layer during the diffusion of said impurity in step (d) and further including the steps of:

f. forming a diffused region of said second conductivity type into the surface portion of said epitaxial layer bounded by said grooves to a depth to contact said inversion layer; and g. forming an additional diffused regions of said first conductivity type into a surface portion of the diffused region formed in step (f).

13. A method according to claim 12, wherein before the step of filling a metal within the groove, the surfaces of the groove are coated with a thin metal layer capable of forming ohmic connection with the epitaxial layer.

* * * * *